(12) United States Patent
Kim et al.

(10) Patent No.: US 7,492,226 B2
(45) Date of Patent: Feb. 17, 2009

(54) LINEARIZATION APPARATUS OF TRIODE REGION TYPE OPERATIONAL TRANSCONDUCTANCE AMPLIFIER

(75) Inventors: Young-Ho Kim, Daejon (KR); Seong-Su Park, Daejon (KR)

(73) Assignee: Electronics and Telecommunications Research Institute (KR)

( * ) Notice: Subject to any disclaimer, the term of this patent is extended or adjusted under 35 U.S.C. 154(b) by 91 days.

(21) Appl. No.: 11/644,066

(22) Filed: Dec. 22, 2006

(65) Prior Publication Data

US 2008/0048780 A1 Feb. 28, 2008

(30) Foreign Application Priority Data

Aug. 25, 2006 (KR) .................. 10-2006-0081309

(51) Int. Cl.
    H03F 3/45 (2006.01)
(52) U.S. Cl. .................................... 330/261
(58) Field of Classification Search ............. None
    See application file for complete search history.

(56) References Cited

U.S. PATENT DOCUMENTS

| | | | | |
|---|---|---|---|---|
| 6,166,592 A * | 12/2000 | Walden | .................. | 327/562 |
| 6,181,204 B1 * | 1/2001 | Smith et al. | .................. | 330/261 |
| 6,489,848 B2 * | 12/2002 | Smith et al. | .................. | 330/261 |
| 6,724,258 B1 | 4/2004 | Fayed | | |
| 6,985,035 B1 * | 1/2006 | Khorramabadi | ............. | 330/253 |
| 7,170,349 B2 * | 1/2007 | Bhattacharjee et al. | ...... | 330/254 |
| 7,183,849 B2 * | 2/2007 | Hu | .............. | 330/254 |
| 7,233,204 B2 * | 6/2007 | Kim et al. | .................. | 330/260 |
| 7,254,164 B2 * | 8/2007 | Behzad | ....................... | 375/219 |
| 7,262,660 B2 * | 8/2007 | Wei | ............................ | 330/254 |
| 7,345,527 B2 * | 3/2008 | Park et al. | .................. | 327/552 |

FOREIGN PATENT DOCUMENTS

| | | |
|---|---|---|
| KR | 10-2006-0091987 | 8/2006 |
| KR | 10-0265336 B1 | 6/2000 |
| KR | 2001-0029754 A | 4/2001 |
| KR | 10-2004-0094242 | 11/2004 |
| KR | 10-2005-0026668 | 3/2005 |
| KR | 10-2005-0066466 | 6/2005 |

(Continued)

OTHER PUBLICATIONS

Salimi, K., et al., "Continuous-time CMOS circuits based on multi-tanh linearisation principle," Electronics Letters, vol. 38, No. 3 (Jan. 31, 2002) pp. 103-104.

Sanduleanu, M.A.T., et al., "Large swing, high linearity transconductor in 0.5μm CMOS technology," Electronics Letters, vol. 34, No. 9 (Apr. 30, 1998) pp. 878-880.

Szczepanski, S., et al., "Differential Pair Transconductor Linearisation Via Electronically Controlled Current-Mode Cells," Electronics Letters, vol. 28, No. 12 (Jun. 4, 1992) pp. 1093-1095.

* cited by examiner

*Primary Examiner*—Robert Pascal
*Assistant Examiner*—Krista M Flanagan
(74) *Attorney, Agent, or Firm*—Blakely, Sokoloff, Taylor & Zafman

(57) ABSTRACT

Provided is a linearization apparatus of a triode region type operational transconductance amplifier that can provide a wide linear input range even when a differential pair input transistor having a short channel length is used at a low power supply voltage. The linearization apparatus of the triode region type operational transconductance amplifier includes: a first transconductor unit for receiving differential pair input voltages through differential pair input transistors and generating a basic transconductance; and a second transconductor unit for receiving the same differential pair input voltages, generating distortion transconductances, and overlapping the basic transconductace with the distortion transconductance for extending a linear range of a final transconductance.

7 Claims, 14 Drawing Sheets

US 7,492,226 B2

LINEARIZATION APPARATUS OF TRIODE REGION TYPE OPERATIONAL TRANSCONDUCTANCE AMPLIFIER

FIELD OF THE INVENTION

The present invention relates to a semiconductor device; and, more particularly, to a linearization apparatus of triode region type operational transconductance amplifier.

DESCRIPTION OF RELATED ART

An operational transconductance amplifier (hereinafter, referred to as an OTA) is a circuit for converting an input voltage into a proportional output current. The OTA is widely used in analog circuits, such as an active filter, an analog-digital converter, a delta-sigma modulator, a multiplier, an oscillator, an integrator, and a gyrator.

The OTA must have following characteristics. First, the OTA must have a very high input/output impedance in order to reduce a load effect. Second, the OTA must have an infinite operating frequency band in order to constantly maintain a magnitude and phase of an output current, regardless of an input frequency. Third, the OTA must be able to easily tune a voltage-to-current conversion in a wide range. Fourth, the OTA must have a high common mode rejection ratio (CMRR) in order to make an output DC voltage be close to an input DC voltage. Fifth, the OTA must generate an output current at a constant ratio with respect to an input voltage within a linear input voltage range. Among them, the linear input/output range is the most important parameter in determining a transconductance characteristic. Specifically, in order to satisfy a signal to noise ratio and a distortion ratio required by a system, the linear input/output range must be wide and maintain a predetermined value within an error range.

In wireless communication SoC design chips, many attempts have been made to achieve high integration and low power. To this end, it is essential to perform a deep sub-micron process and use a low voltage of less than 1 V. However, because a design environment for meeting the system specification becomes poorer, circuit designers experience difficulty. Therefore, in order to secure a wide dynamic range at a low voltage in an equal noise environment, researches on circuits having a wide linear input/output range must be preceded.

Various OTA linearization methods have been known. OTAs implemented with complementary metal oxide semiconductor (CMOS) transistors can be classified into three categories: a circuit configuration using transistors operating in a saturation region, a circuit configuration using transistors operating in a triode region, and a circuit configuration using a combined structure thereof.

FIG. 1 is a circuit diagram of a conventional OTA using transistors operating in a saturation region. The structure of the OTA shown in FIG. 1 is called a "degenerated differential pairs" structure. The OTA having the "degenerated differential pairs" structure maintains linearity by connecting input metal oxide semiconductor (MOS) transistors M1 and M2 operating in a saturation region to a tunable resistor (not shown) or a MOS transistor $M_R$ operating in a triode region. However, the OTA of FIG. 1 tends to degrade the linearity when the tunable resistor component is less than an impedance $(1/G_{m1,2})$ looking from sources of the input MOS transistors M1 and M2.

FIG. 2 is a circuit diagram of a conventional OTA having a square-law structure. Referring to FIG. 2, the resistor component of FIG. 1 is replaced with MOS transistors M3 and M4. The MOS transistors M1, M2, M3 and M4 operate in a saturation region. The OTA of FIG. 2 is widely used in a high frequency system because it can obtain a high current gain, but has a narrow linear input range because its linearity characteristic is poor.

FIG. 3 is a circuit diagram of a conventional OTA using transistors operating in a triode region. Referring to FIG. 3, MOS transistors M1 and M2 operating in a triode region and exhibiting a linear current characteristic with respect to an input voltage are used as input transistors. A regulated cascode circuit is further included to enable the input transistors M1 and M2 to always operate in the triode region. The regulated cascode circuit includes amplifiers 31 and 32 and MOS transistors M3 and M4 connected to the amplifiers 31 and 32, respectively. Drain-source voltages (Vds) of the input transistors M1 and M2 have a small fixed value making them exist in the triode region. The transconductance and the tuning region are determined by the fixed value. At this point, the drain-source voltages can be adjusted using a DC voltage (Vc) inputted to positive terminals of the amplifiers 31 and 32.

The OTA of FIG. 1 having the "degenerated differential pairs" structure and the OTA of FIG. 2 having the square-law structure are advantageous to high-speed operation and high gain. However, unlike the OTA of FIG. 3, the OTAs of FIGS. 1 and 2 need to extend the linear input range and reduce distortion components. Further, the OTAs of FIGS. 1 and 2 are not suitable for a low voltage circuit because they operate in the saturation region. Moreover, compared with the OTA of FIG. 3 operating in the triode region, the OTAs of FIGS. 1 and 2 have a narrower linear range and a wide error range of the transconductance within the linear range.

In the triode region type OTA of FIG. 3 using the gain-boosting amplifier feedback, a wide linearity characteristic can be obtained by increasing the DC voltage inputted to gates of the MOS transistors M1 and M2. However, if the DC voltage is increased, a constant transconductance cannot be maintained within a wide signal range. Specifically, as a gate voltage increases, electric charges are attracted toward a gate oxide layer, blocked by an energy barrier of the gate oxide layer, and rebounded toward a channel. In other words, a drift velocity of carriers is decreased due to a scattering phenomenon occurring between inversion carriers and the gate oxide layer.

Therefore, the output currents Io1 and Io2 do not linearly increase but decreases in a real environment as the input voltages $V_P$ and $V_m$ increase. Also, the transconductance does not maintain a constant value but decreases. As illustrated in FIG. 3, the use of the differential pair inputs can secure a higher linearity than the use of a single input. However, there is a limitation in obtaining a perfect linearity. The reason for this is that nonlinearity characteristic is still exhibited even in the differential pair input structure due to a variation of an electron mobility.

Referring to FIGS. 4 and 5, as the input signal Vin increases, a current I1 or I2 of a MOS transistors M1 or M2 exhibits a significant nonlinearity characteristic. Although the differential pair input structure can improve nonlinearity characteristic and secure a wider linear current range than the single input structure. However, because of the above-described reasons, the differential pair input structure secures a limited linear range.

Meanwhile, a sufficient headroom must be secured in order to prevent signal distortion caused when an output swing of the OTA is saturated at a low power supply voltage. To this end, the drain-source voltage Vx of the MOS transistors M1 and M2 of FIG. 4 must have a low level. However, as the drain-source voltage decreases, a width to length (W/L) ratio of the MOS transistor becomes relatively high in order to satisfy a desired transconductance. In this case, if transistors having a long channel length are used as the input transistors, the width also has a relatively large value, resulting in degradation of a frequency characteristic. That is, due to the increased area of the input transistor, a large capacitance is generated. Thus, an operable frequency range is lowered. For this reason, the channel length of the input transistor must have a short channel length in order for a smooth frequency operation. However, as the input transistor has a short channel of less than 0.18 µm, the input linear range becomes narrower due to a short channel effect.

SUMMARY OF THE INVENTION

It is, therefore, an object of the present invention to provide a linearization apparatus of a triode region type OTA that can provide a wide linear input range even when a differential pair input transistor having a short channel length is used at a low power supply voltage.

In accordance with an aspect of the present invention, there is provided a linearization apparatus of a triode region type OTA, including: a first transconductor unit for receiving differential pair input voltages through differential pair input transistors and generating a basic transconductance; and a second transconductor unit for receiving the same differential pair input voltages, generating distortion transconductances, and overlapping the basic transconductace with the distortion transconductance for extending a linear range of a final transconductance.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE INVENTION

Other objects and aspects of the invention will become apparent from the following description of the embodiments with reference to the accompanying drawings, which is set forth hereinafter.

Embodiment 1

Figure 6:
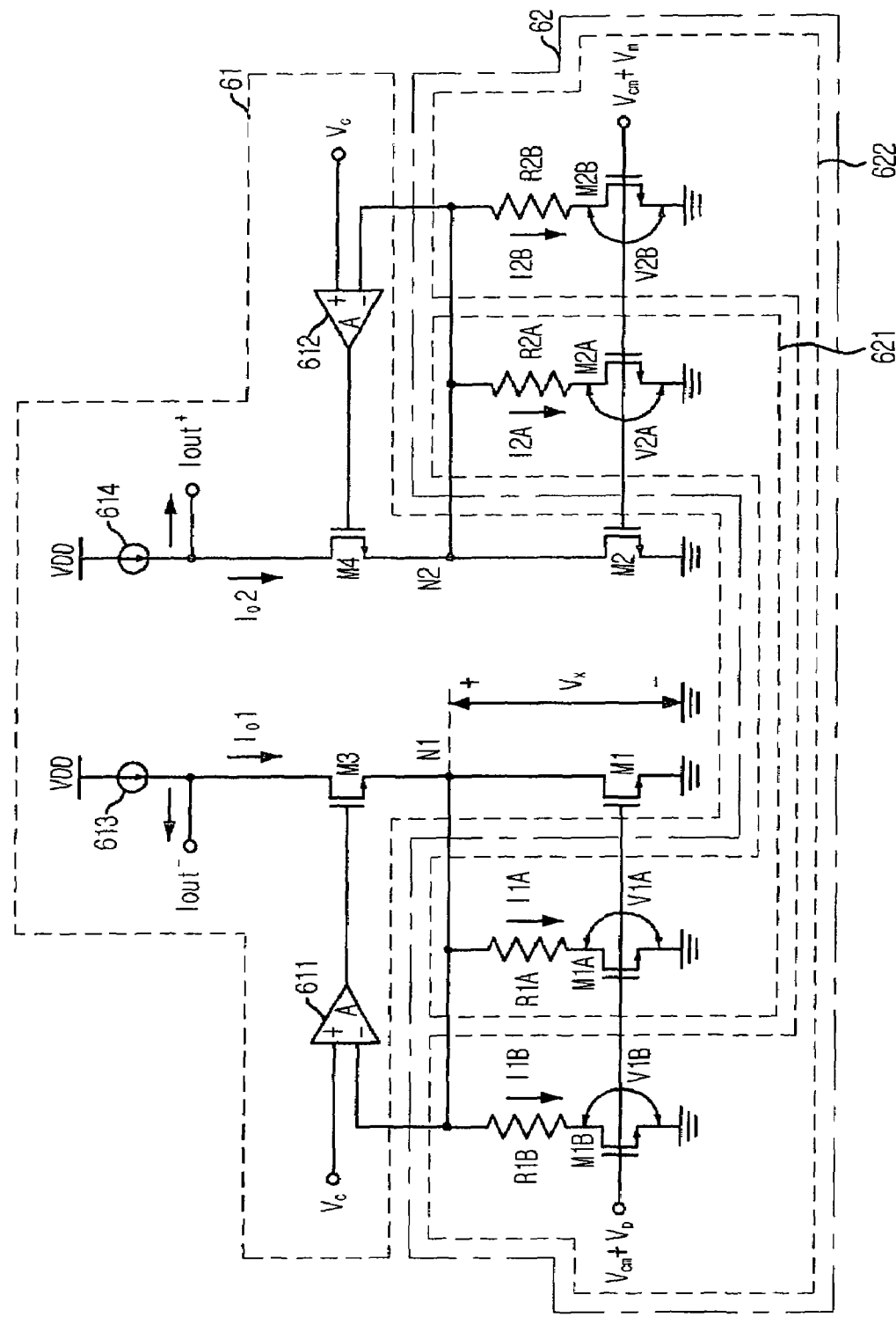
FIG. 6 is a circuit diagram of a triode region type OTA in accordance with a first embodiment of the present invention.

FIG. 6 is a circuit diagram of a triode region type OTA in accordance with a first embodiment of the present invention.

Referring to FIG. 6, the OTA includes a first trahsconductor 61 and a second transconductor 62. The first transconductor 61 receives differential pair input voltages $V_P$ and $V_M$ to generate basic transconductance. The second transconductor 62 receives the differential pair input voltages $V_P$ and $V_m$ to generate distortion transconductance, and compensates linearity of the transconductance of the first transconductor 61 by overlapping the basic transconductance with the distortion transconductance, thereby maintaining a final transconductance having a constant value within a wide linear range.

The first transconductor 61 includes first to fourth NMOS transistors M1, M2, M3 and M4, first and second amplifiers 611 and 612, and first and second current sources 613 and 614. The third and fourth NMOS transistors M3 and M4 and the first and second amplifiers 611 and 612 construct a regulated cascode circuit. The first and second current sources 613 and 614 are implemented with PMOS transistors and supply a constant current.

The first NMOS transistor M1 operates in a triode region. The first NMOS transistor M1 has a gate receiving the differential pair input voltage $V_P$, a source connected to a ground voltage terminal, and a drain connected to a first node N1. The second NMOS transistor M2 operates in a triode region. The second NMOS transistor M2 has a gate receiving the differential pair input voltage $V_m$, a source connected to the ground voltage terminal, and a drain connected to a second node N2. The third NMOS transistor M3 has a gate connected to an output terminal of the first amplifier 611, a source connected to the first node N1, and a drain connected to the first current source 613. The fourth NMOS transistor M4 has a gate connected to an output terminal of the second amplifier 612, a source connected to the second node N2, and a drain connected to the second current source 614. The first amplifier 611 has a positive input terminal receiving a reference voltage VC and a negative input terminal connected to the first node N1. The first amplifier 611 makes a node voltage VX of the first node N1 always have a constant level by comparing the node voltage VX with the reference voltage VC. The second amplifier 612 has a positive input terminal receiving the reference voltage VC and a negative input terminal connected to the second node N2. The second amplifier 612 makes a node voltage VX of the second node N2 by comparing the node voltage VX with the reference voltage VC.

The second transconductor 62 includes a first distortion transconductance generating unit 621 for generating a first distortion transconductance and a second distortion transconductance generating unit 622 for generating a second distortion transconductance having a different characteristic from the first distortion transconductance.

The first distortion transconductance generating unit 621 includes first and second resistors R1A and R2A and fifth and sixth NMOS transistors M1A and M2A. The first resistor R1A is connected between the first node N1 and a drain of the fifth NMOS transistor M1A. The fifth NMOS transistor M1A operates in a triode region. The fifth NMOS transistor M1A has a gate receiving the differential pair input voltage $V_P$, a source connected to the ground voltage terminal, and the drain connected in series to the first resistor R1A. The second resistor R2A is connected between the second node N2 and a drain of the sixth NMOS transistor M2A. The sixth NMOS transistor M2A operates in a triode region. The sixth NMOS transistor M2A has a gate receiving the differential pair input voltage $V_m$, a source connected to the ground voltage terminal, and the drain connected in series to the second resistor R2A.

The second distortion transconductance generating unit 622 includes third and fourth resistors R1B and R2B and seventh and eighth NMOS transistors M1B and M2B. The third resistor R1B is connected between the first node N1 and a drain of the seventh NMOS transistor M1B. The seventh NMOS transistor M1B operates in a triode region. The seventh NMOS transistor M1B has a gate receiving the differential pair input voltage $V_P$, a source connected to the ground voltage terminal, and the drain connected in series to the third resistor R1B. The fourth resistor R2B is connected between the second node N2 and a drain of the eighth NMOS transistor M2B. The eighth NMOS transistor M2B operates in a triode region. The eighth NMOS transistor M2B has a gate receiving the differential pair input voltage $V_m$, a source connected to the ground voltage terminal, and the drain connected in series to the fourth resistor R2B.

An operation characteristic of the OTA in accordance with the first embodiment of the present invention will be described below.

First, an operation characteristic of the first distortion transconductance generating unit 621 will be described. A drain-source voltage V1A of the fifth NMOS transistor M1A can be adjusted according to a resistance of the first resistor R1A and changes a slope of the distortion transconductance generated by the first resistor R1A and the fifth NMOS transistor M1A. Likewise, a drain-source voltage V2A of the sixth NMOS transistor M2A can be adjusted according to a resistance of the second resistor R2A and changes a slope of the distortion transconductance generated by the second resistor R2A and the sixth NMOS transistor M2A. More specifically, the drain-source voltages V1A and V2A of the fifth and sixth NMOS transistors M1A and M2A are determined by currents I1A and I2A flowing through the first and second resistors R1A and R2A connected in series to the fifth and sixth NMOS transistors M1A and M2A, respectively. That is, the drain-source voltages V1A and V2A of the fifth and sixth NMOS transistors M1A and M2A are determined by the product of the resistances of the first and second resistors R1A and R2A and the currents I1A and I2A, respectively. In this way, the first distortion transconductance of the first distortion transconductance generating unit 621 can be adjusted.

Next, an operation characteristic of the second distortion transconductance generating unit 622 will be described. A drain-source voltage V1B of the seventh NMOS transistor M1B can be adjusted according to a resistance of the third resistor R1B and changes a slope of the distortion transconductance generated by the third resistor R1B and the seventh NMOS transistor M1B. Likewise, a drain-source voltage V2B of the eighth NMOS transistor M2B can be adjusted according to a resistance of the fourth resistor R2B and changes a slope of the distortion transconductance generated by the fourth resistor R2B and the eighth NMOS transistor M2B. More specifically, the drain-source voltages V1B and V2B of the seventh and eighth NMOS transistors M1B and M2B are determined by currents I1B and I2B flowing through the third and fourth resistors R1B and R2B connected in series to the seventh and eighth NMOS transistors M1B and M2B, respectively. That is, the drain-source voltages V1B and V2B of the seventh and eighth NMOS transistors M1B and M2B are determined by the product of the resistances of the third and fourth resistors R1B and R2B and the currents I1B and I2B, respectively. In this way, the second distortion transconductance of the second distortion transconductance generating unit 622 can be adjusted.

As described above, the first and second distortion transconductance generating units 621 and 622 adjust the resistors R1A, R2A, R1B and R2B and W/L ratio of the NMOS transistors M1A, M2A, M1B and M2B and generate the first and second distortion transconductances by nonlinearly changing the output current with respect to the input voltage. For example, the output current with respect to the input voltage can be nonlinearly changed by fixing the resistors R1A, R2A, R1B and R2B and changing the W/L ratio (M1A(W/L)/M2A(W/L)=M1B(W/L)/M2B(W/L)) of the NMOS transistors M1A, M2A, M1B and M2B, or by fixing the W/L ratio of the NMOS transistors M1A, M2A, M1B and M2B and changing the resistance ratio (R1A/R2A=R1B/R2B) of the resistors R1A, R2A, R1B and R2B.

In this way, the first and second distortion transconductance generating units 621 and 622 generate the first and second distortion transconductances and overlap the first and second distortion transconductances with the basic transconductance from the first transconductor 61, so that the transconductance of the first transconductor 61 can be compensated to have linearity in a nonlinear region. Consequently, the linearity of a total transconductance can be extended.

Figure 1:
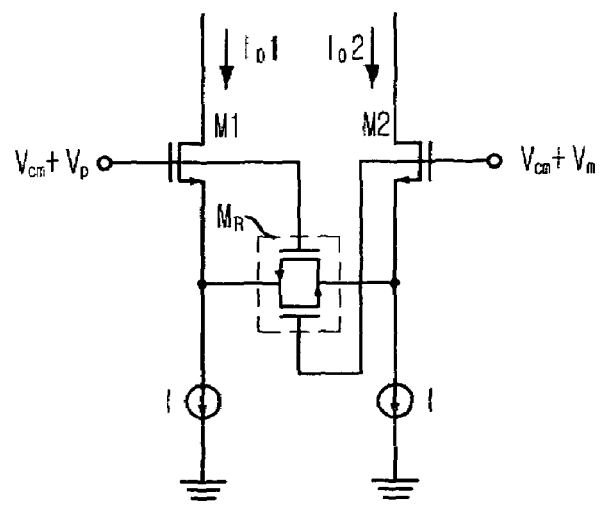
FIG. 1 is a circuit diagram illustrating one example of a linearization structure of a conventional OTA implemented with MOS transistors.
Figure 2:
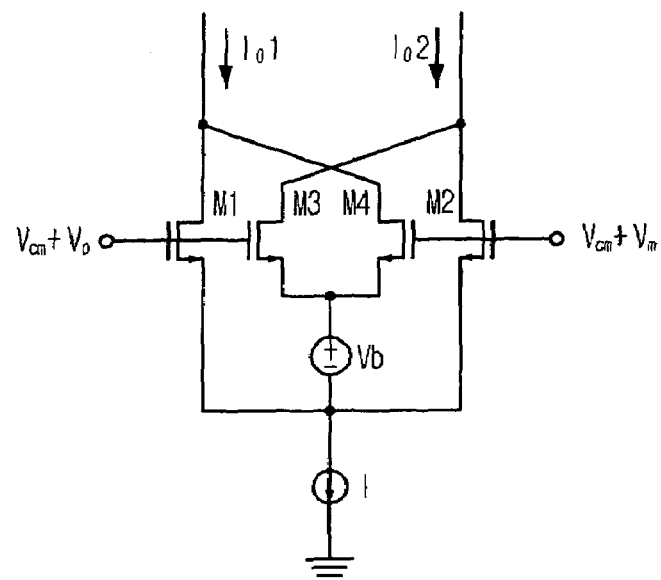
FIG. 2 is a circuit diagram illustrating another example of a linearization structure of a conventional OTA implemented with MOS transistors.
Figure 3:
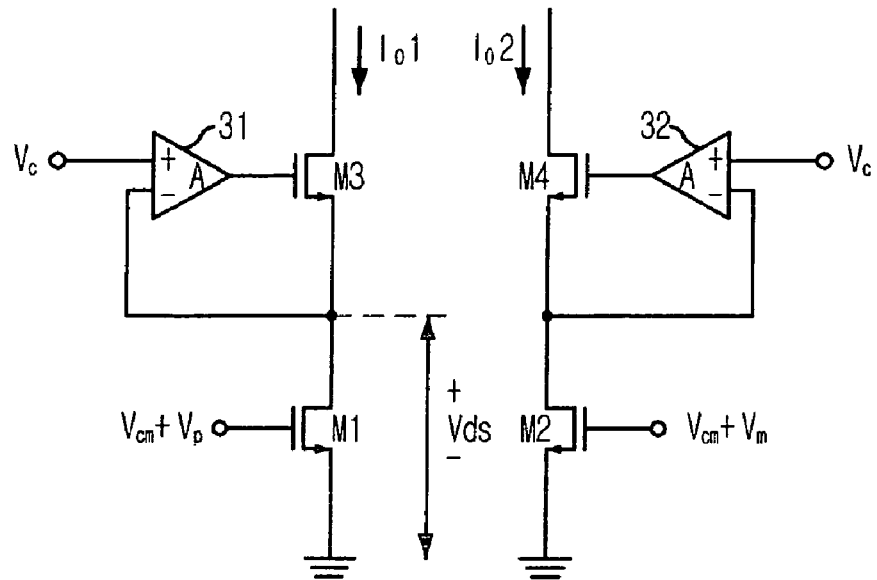
FIG. 3 is a circuit diagram illustrating a further another example of a linearization structure of a conventional OTA implemented with MOS transistors.
Figure 4:
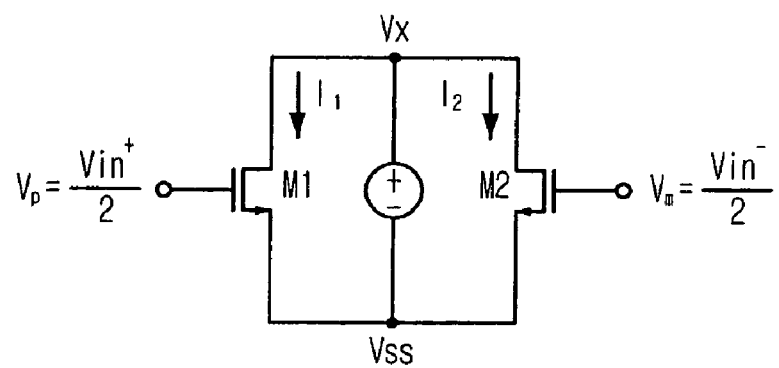
FIG. 4 is an equivalent circuit diagram illustrating an operation of the linearization structure of FIG. 3.
Figure 5:
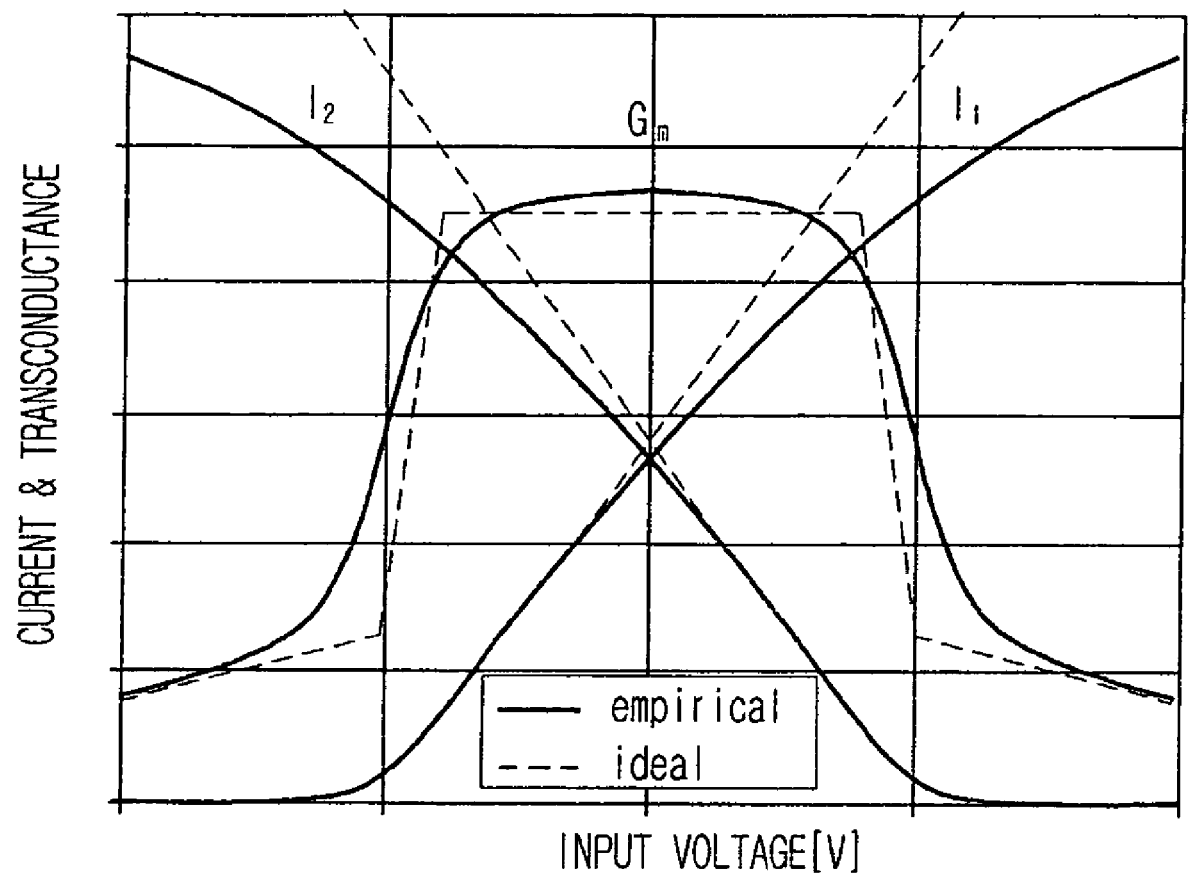
FIG. 5 is a graph of an output current and a transconductance with respect to an input voltage of the linearization structure of FIG. 3.
Figure 7:
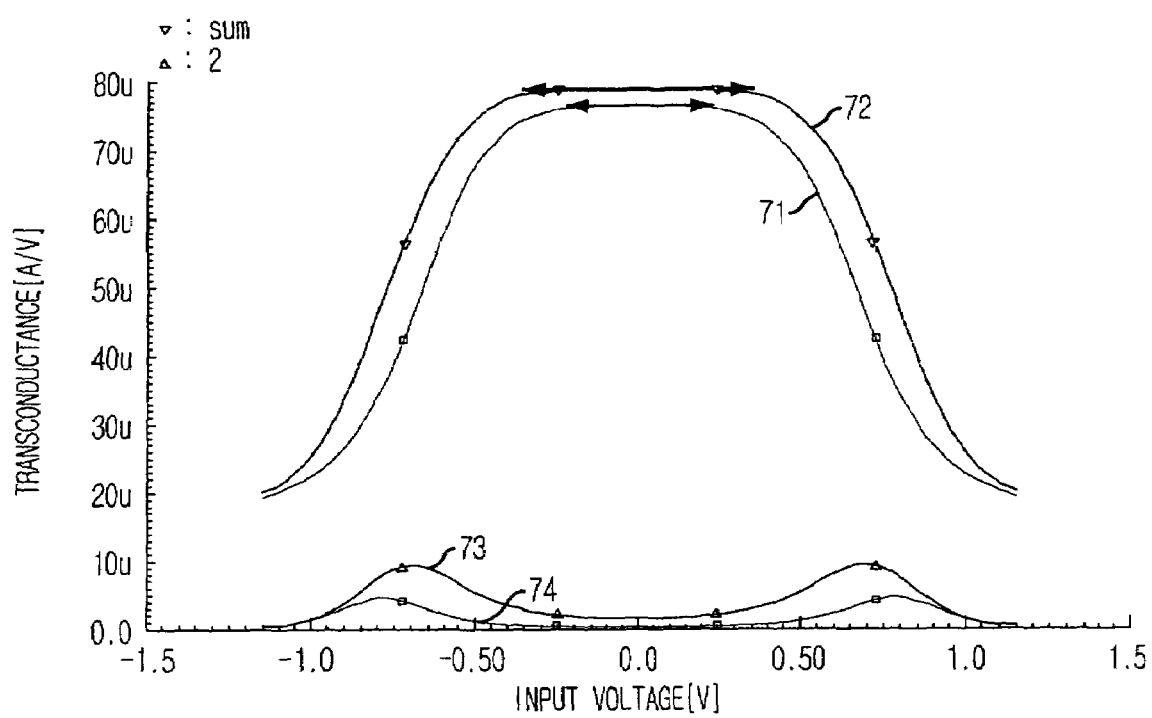
FIG. 7 is a graph of a transconductance with respect to an input voltage in the OTA of FIG. 6.
Figure 8:
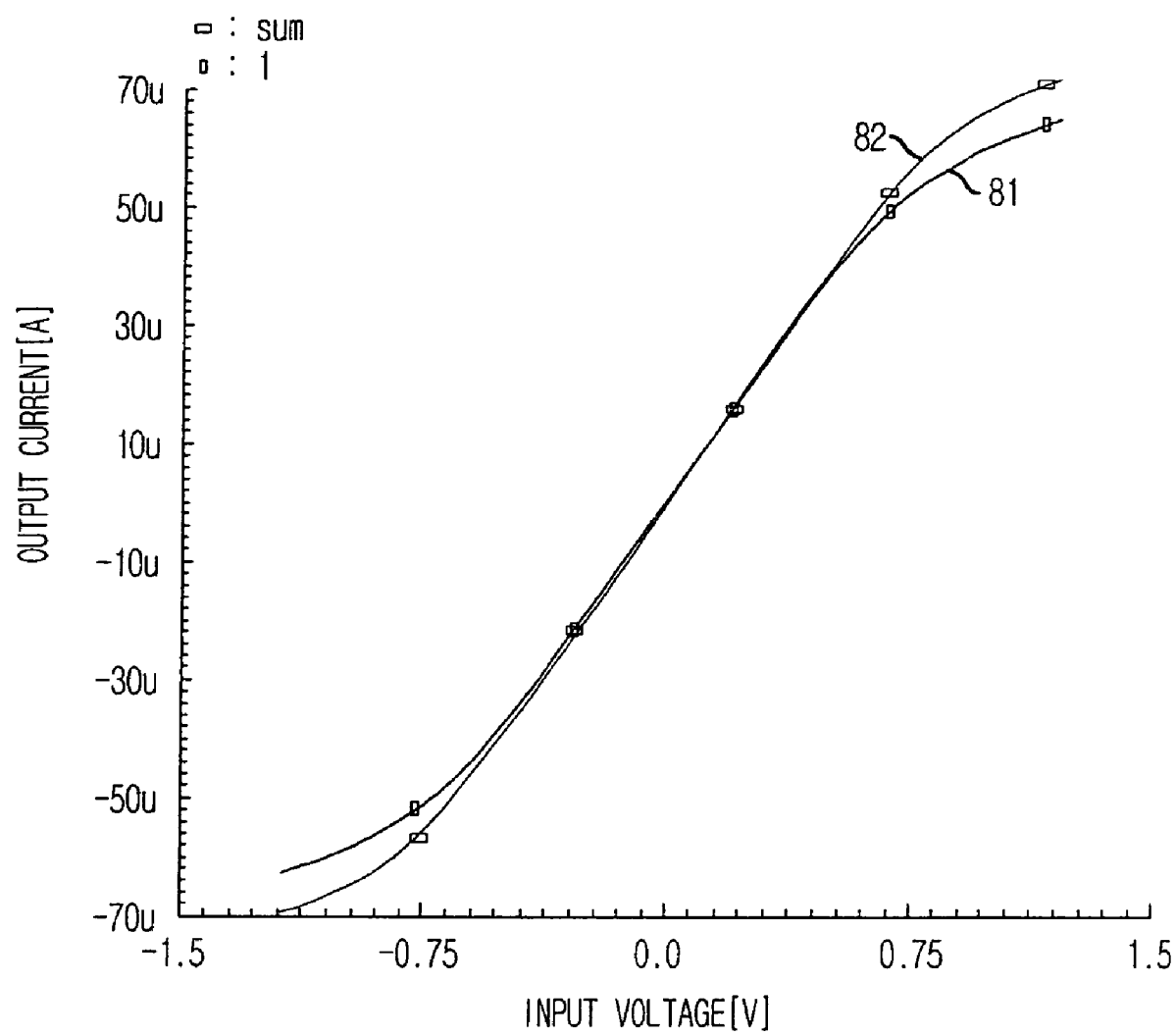
FIG. 8 is a graph of an output current characteristic with respect to an input voltage in the OTA of FIG. 6.
Figure 9:
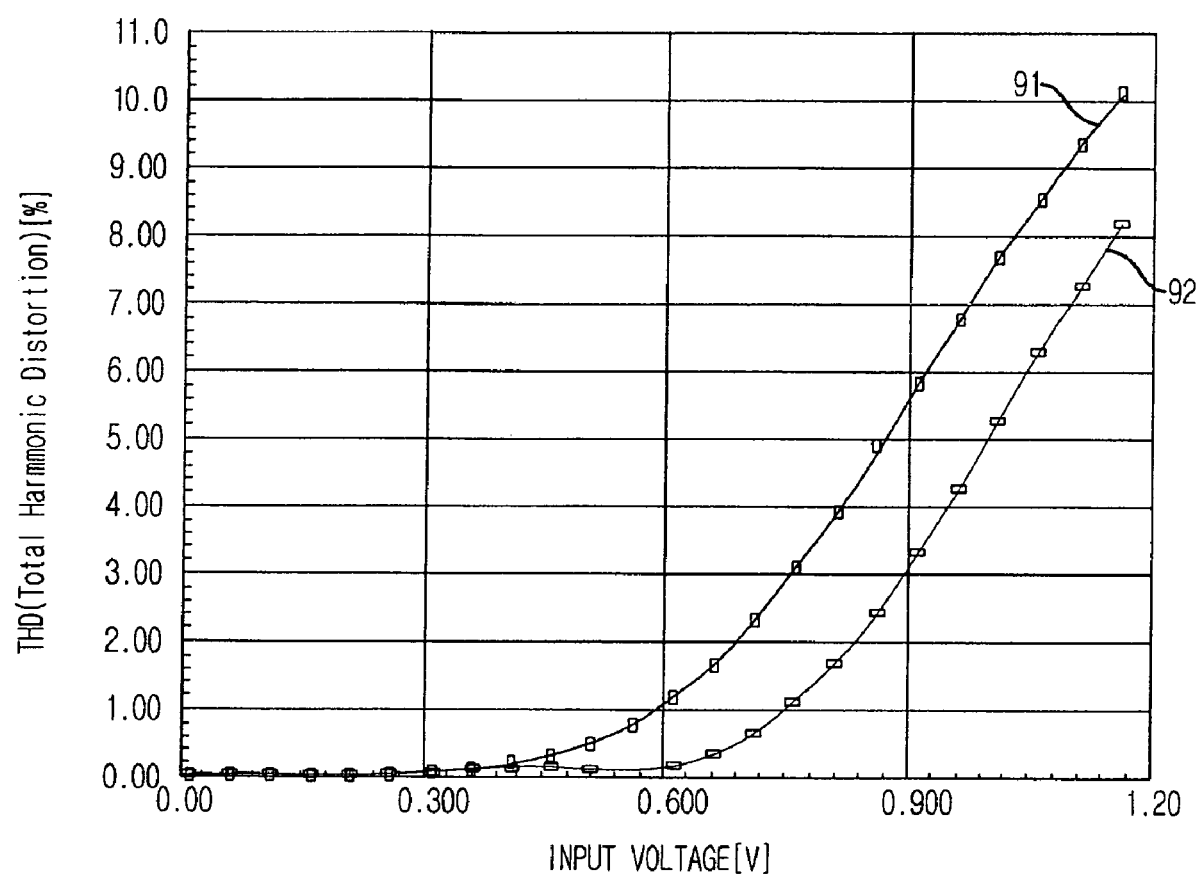
FIG. 9 is a graph of a total harmonic distortion characteristic with respect to an input voltage in the OTA of FIG. 6.

The operation characteristic of the conventional OTA of FIG. 3 and the operation characteristic of the OTA of FIG. 6 in accordance with the first embodiment of the present invention will be compared with each other with reference to FIGS. 7 to 9.

FIGS. 7 to 9 are graphs showing simulation results when the W/L ratios of the NMOS transistors M1A, M1B, M2A and M2B are fixed and the resistance ratios (R1A/R2A, R1B/R2B) of the resistors R1A, R1B, R2A and R2B are set differently. That is, FIGS. 7 to 9 are graphs showing simulation results measured under conditions of R1A<R2A and R1B<R2B.

Specifically, FIG. 7 is a characteristic graph for comparing the transconductance of the conventional triode region type OTA of FIG. 3 with the transconductance of the triode region type OTA of FIG. 6 in accordance with the first embodiment of the present invention. In FIG. 7, an X-axis represents the input voltage and a Y-axis represents the transconductance.

In FIG. 7, a reference numeral 71 represents a waveform of the transconductance of the conventional triode region type OTA of FIG. 3, and a reference numeral 72 represents a waveform of the transconductance of the triode region type OTA of FIG. 6 in accordance with the first embodiment of the present invention. Also, a reference number 73 represents a waveform of the first distortion transconductance obtained through the first distortion transconductance generating unit 621, and a reference number 74 represents a waveform of the second distortion transconductance obtained through the second distortion transconductance generating unit 622.

As illustrated in FIG. 7, the transconductance 72 in accordance with the first embodiment of the present invention is expressed as a total sum of the conventional transconductance 71 and the first and second distortion transconductances 73 and 74. That is, it can be seen from FIG. 7 that the first and second distortion transconductances 73 and 74 compensate the linearity of the transconductance 71 of the nonlinear region, which is obtained through the conventional OTA of FIG. 3, and extends the linear region where a constant transconductance is maintained, compared with the related art.

FIG. 8 is a characteristic graph for comparing a current-voltage characteristic of the conventional OTA of FIG. 3 with a current-voltage characteristic of the OTA of FIG. 6 in accordance with the first embodiment of the present invention. In FIG. 8, an X-axis represents the input voltage and a Y-axis represents the output current.

In FIG. 8, a reference numeral 81 represents a waveform of a current-voltage characteristic of the conventional triode region type OTA of FIG. 3, and a corresponding transconductance waveform corresponds to the waveform 71 of FIG. 7. A reference numeral 82 represents a waveform of a current-voltage characteristic of the triode region type OTA of FIG. 6 in accordance with the first embodiment of the present invention, and a corresponding transconductance waveform corresponds to the waveform 72 of FIG. 7.

It can be seen from FIG. 8 that the OTA in accordance with the first embodiment of the present invention has a wider linear input/output characteristic than the conventional OTA of FIG. 3.

FIG. 9 is a total harmonic distortion (THD) characteristic graph, showing the output current distortion with respect to the input in the conventional OTA of FIG. 3 and the OTA of FIG. 6 in accordance with the first embodiment of the present invention. In FIG. 9, an X-axis represents the input voltage and a Y-axis represents the total harmonic distortion.

In FIG. 9, a reference numeral 91 represents a waveform of the total harmonic distortion characteristic of the conventional triode region type OTA of FIG. 3, and a reference numeral 92 represents a waveform of the total harmonic distortion characteristic of the triode region type OTA of FIG. 6 in accordance with the first embodiment of the present invention.

It can be seen from FIG. 9 that the conventional OTA has the linear input range of about $0.6 \times V_P$ within 1% error range but the OTA in accordance with the first embodiment of the present invention has the linear input range of about $0.75 \times V_P$.

From the simulation results of FIGS. 7 to 9, it can be seen that the triode region type OTA of FIG. 6 in accordance with the first embodiment of the present invention has an improved linear characteristic compared with the conventional OTA of FIG. 3.

Embodiment 2

Figure 10:
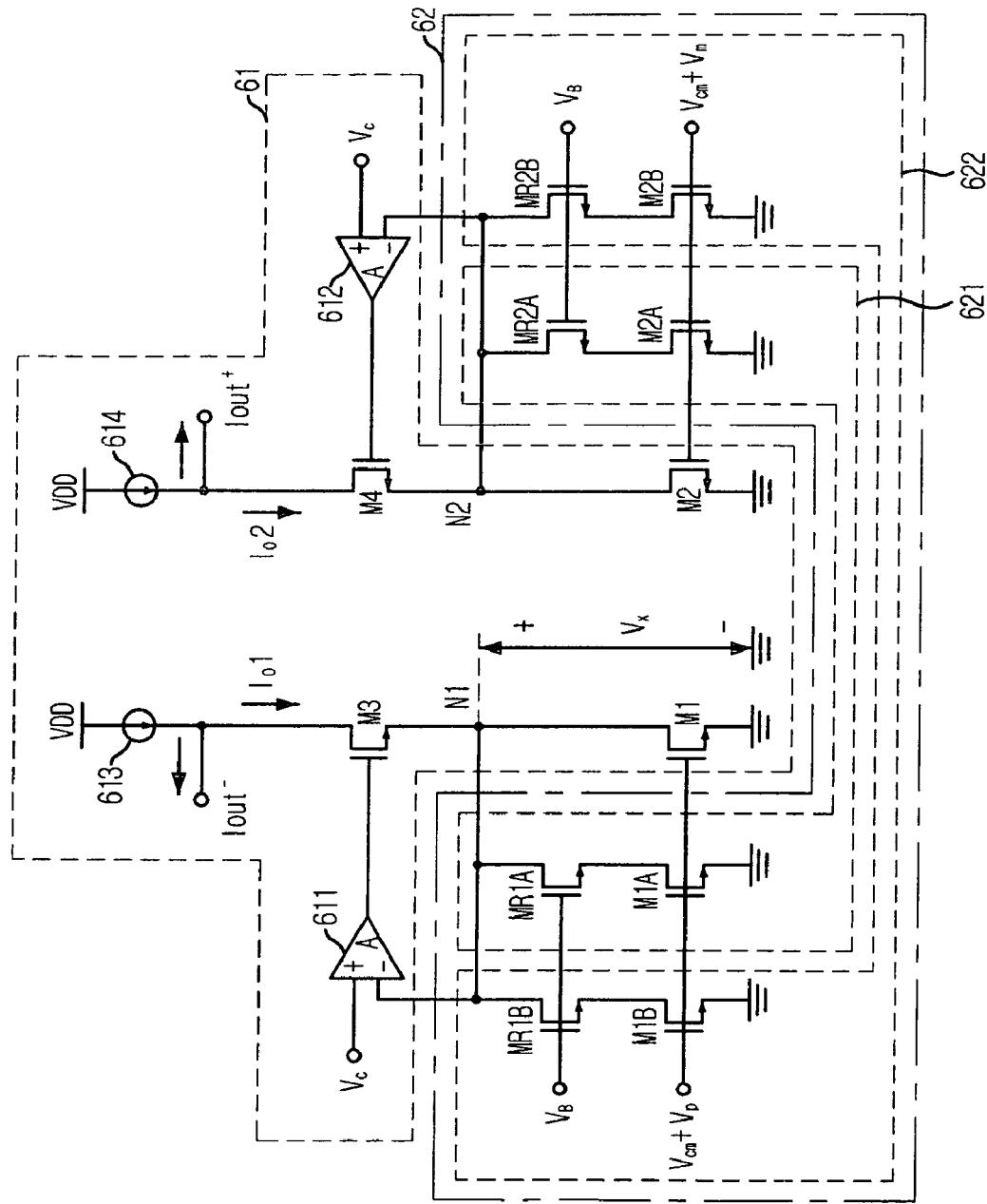
FIG. 10 is a circuit diagram of a triode region type OTA in accordance with a second embodiment of the present invention.

FIG. 10 is a circuit diagram of a triode region type OTA in accordance with a second embodiment of the present invention. In FIGS. 6 and 10, the same reference numerals refer to the same elements. A duplicate description about the elements that have been already described with reference to FIG. 6 will be omitted.

Referring to FIG. 10, the OTA in accordance with the second embodiment of the present invention uses active resistors implemented with MOS resistors, while the OTA in accordance with the first embodiment of the present invention uses passive resistors. That is, the first and second distortion transconductance generating units 621 and 622 of FIG. 10 are configured in such a way that two MOS transistors are connected in series.

More specifically, the first distortion transconductance generating unit 621 includes first and second MOS resistors MR1A and MR2A and fifth and sixth MOS transistors M1A and M2A. The first MOS resistor MR1A is connected between a first node N1 and a drain of the fifth MOS transistor M1A. The fifth MOS transistor M1A operates in a triode region. The fifth MOS transistor M1A has a gate receiving the differential pair input voltage $V_P$, a source connected to a ground voltage terminal, and the drain connected in series to the first MOS resistor MR1A. The second MOS resistor MR2A is connected between a second node N2 and a drain of the sixth MOS transistor M2A. The sixth MOS transistor M2A operates in a triode region. The sixth MOS transistor M2A has a gate receiving the differential pair input voltage $V_m$, a source connected to the ground voltage terminal, and the drain connected in series to the second MOS transistor MR2A.

The second distortion transconductance generating unit 622 includes third and fourth MOS resistors MR1B and MR2B and seventh and eighth MOS transistors M1B and M2B. The third MOS resistor MR1B is connected between the first node N1 and a drain of the seventh MOS transistor M1B. The seventh MOS transistor M1B operates in a triode region. The seventh MOS transistor M1B has a gate receiving the differential pair input voltage $V_P$, a source connected to the ground voltage terminal, and the drain connected in series to the third MOS resistor MR1B. The fourth MOS resistor MR2B is connected between the second node N2 and a drain of the eighth MOS transistor M2A. The eighth MOS transistor M2B operates in a triode region. The eighth MOS transistor M2B has a gate receiving the differential pair input voltage $V_m$, a source connected to the ground voltage terminal, and the drain connected in series to the fourth MOS transistor MR2A.

A voltage used in a bandgap bias circuit or a power supply voltage (VDD) can be used as a gate bias voltage for adjusting the resistances of the first to fourth MOS resistors MR1A, MR1B, MR2A and MR2B. If the MOS resistors are implemented with PMOS transistors, a ground voltage is used. In this case, it is preferable to use a transistor with a long channel length in order to reduce an error of the MOS resistors.

Also, in order to secure a sufficient dynamic range at a low voltage, or smoothly perform an operation without distortion even in a large input signal, a node voltage "VX" must be designed to be less than several tens of mV. In this case, it is preferable that the input transistors M1 and M2 of the first transconductor 61 are designed to have a short channel length, considering parasitic capacitor components generated by the area (W×L) of the input transistors M1 and M2 of the first transconductor 61 and limitation of the operating frequency.

In addition, the areas of the input transistors M1A, M1B, M2A and M2B added in order to minimize 1/f noise and parasitic capacitor components generated by the first and second distortion transconductance generating units 621 and 622 are designed to be small, and the W/L ratio is adjusted. This can be easily designed considering the desired distortion transconductance together with the MOS resistors.

The first to fourth MOS resistors MR1A, MR1B, MR2A and MR2B of the OTA in accordance with the second embodiment of the present invention have the same function as the first to fourth resistors R1A, R1B, R2A and R2B of the OTA in accordance with the first embodiment of the present invention. Therefore, the effect of the second embodiment of the present invention is substantially equal to that of the first embodiment of the present invention.

Embodiment 3

Figure 11:
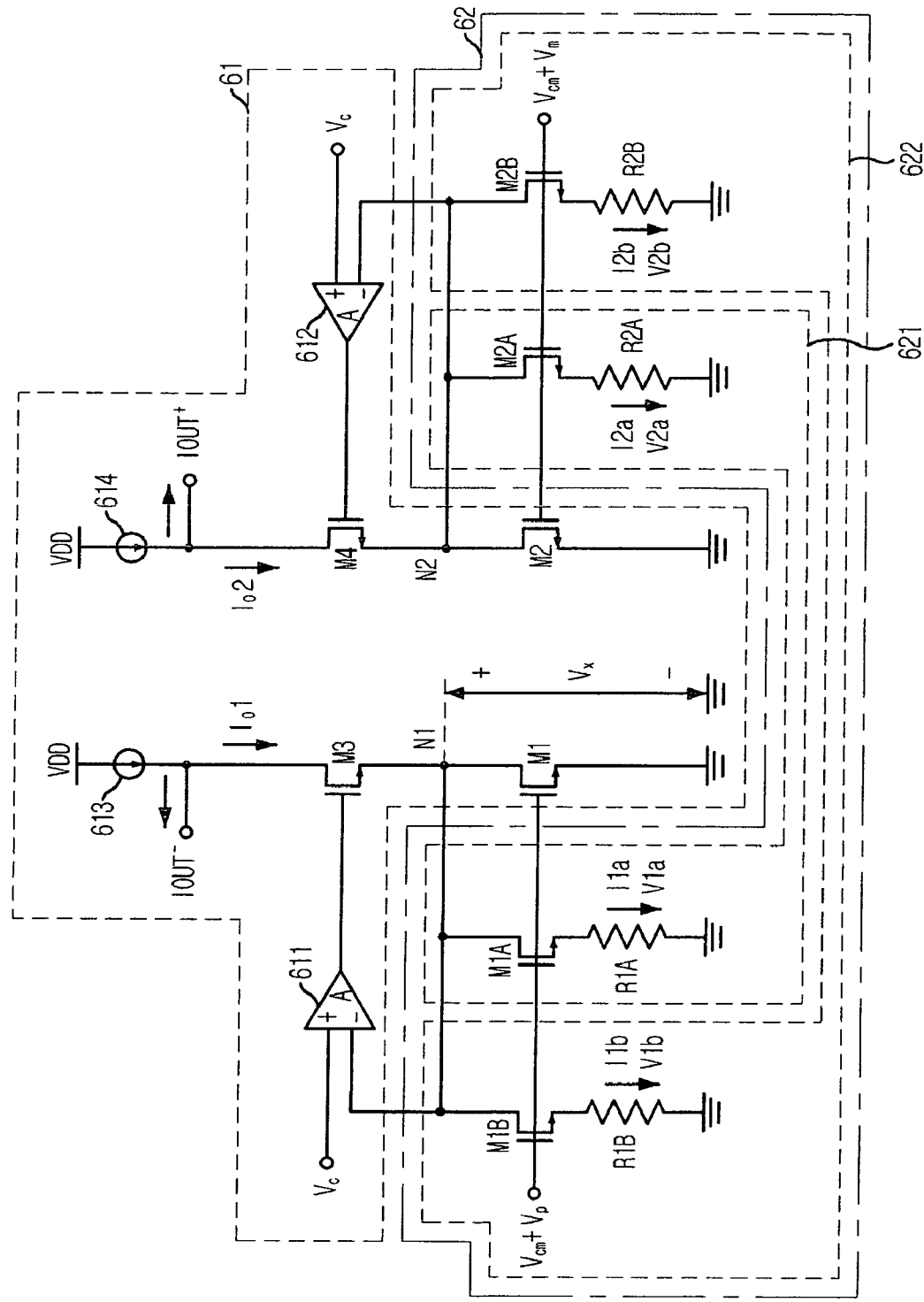
FIG. 11 is a circuit diagram of a triode region type OTA in accordance with a third embodiment of the present invention.

FIG. 11 is a circuit diagram of a triode region type OTA in accordance with a third embodiment of the present invention. In FIGS. 6 and 11, the same reference numerals refer to the same elements. A duplicate description about the elements that have been already described with reference to FIG. 6 will be omitted.

Referring to FIG. 11, only difference between the OTA of FIG. 11 and the OTA of FIG. 6 is the first and second distortion transconductance generating units 621 and 622. Specifically, the positions of the first to fourth resistors R1A, R1B, R2A and R2B and the positions of the fifth to eighth MOS transistors M1A, M1B, M2A and M2B are exchanged.

More specifically, in the first distortion transconductance generating unit 621, a first resistor R1A is connected between a source of a fifth MOS transistor M1A and a ground voltage terminal. The fifth MOS transistor M1A has a gate receiving the differential pair input voltage $V_P$, the source connected to the first resistor R1A, and a drain connected to a first node N1. A second resistor R2A is connected between a source of a sixth MOS transistor M2A and the ground voltage terminal. The sixth MOS transistor M2A has a gate receiving the differential pair input voltage $V_m$, the source connected to the second resistor R2A, and a drain connected to a second node N2.

In the second distortion transconductance generating unit 622, a third resistor R1B is connected between a source of a seventh MOS transistor M1B and the ground voltage terminal. The seventh MOS transistor M1B has a gate receiving the differential pair input voltage $V_P$, the source connected to the third resistor R1B, and a drain connected to the first node N1. A fourth resistor R2B is connected between a source of an eighth MOS transistor M2B and the ground voltage terminal. The eighth MOS transistor M2B has a gate receiving the differential pair input voltage $V_m$, the source connected to the second resistor R2B, and a drain connected to the second node N2.

The OTA of FIG. 11 has the same configuration as the OTA of FIG. 6 other than the arrangement of the resistors R1A, R1B, R2A and R2B of the first and second distortion transconductance generating units 621 and 622. Therefore, the effect of the OTA of FIG. 11 is substantially equal to that of the OTA of FIG. 6.

Embodiment 4

Figure 12:
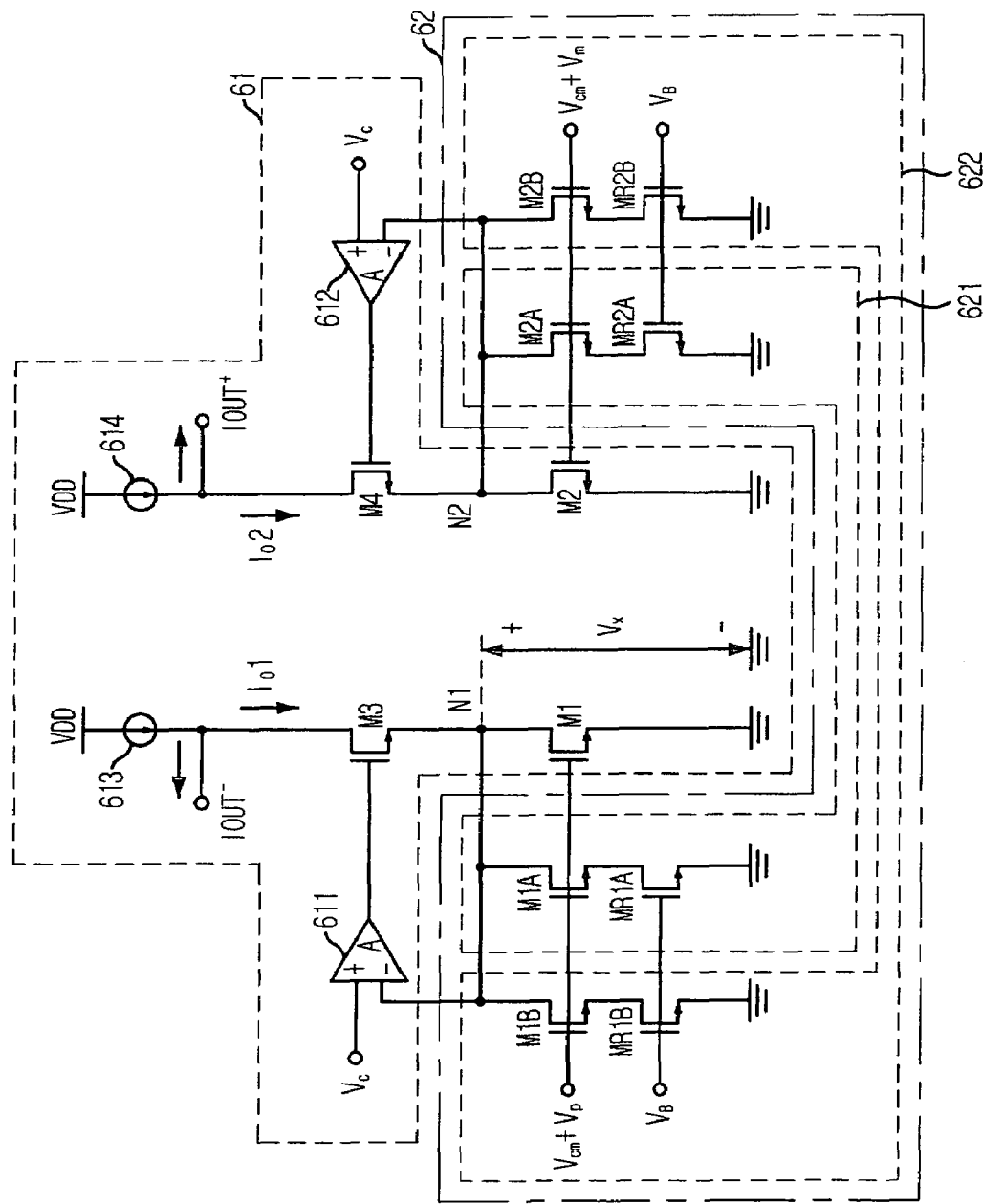
FIG. 12 is a circuit diagram of a triode region type OTA in accordance with a fourth embodiment of the present invention.

FIG. 12 is a circuit diagram of a triode region type OTA in accordance with a fourth embodiment of the present invention. In FIGS. 10 and 12, the same reference numerals refer to the same elements. A duplicate description about the elements that have been already described with reference to FIG. 6 will be omitted.

The OTA of FIG. 12 has the same structure as the OTA of FIG. 10 other than the first and second distortion transconductance generating units 621 and 622. Specifically, only difference between the OTA of FIG. 12 and the OTA of FIG. 10 is that the positions of the first to fourth MOS resistors MR1A, MR1B, MR2A and MR2B and the positions of the fifth to eighth MOS transistors M1A, M1B, M2A and M2B are exchanged.

Embodiment 5

Figure 13:
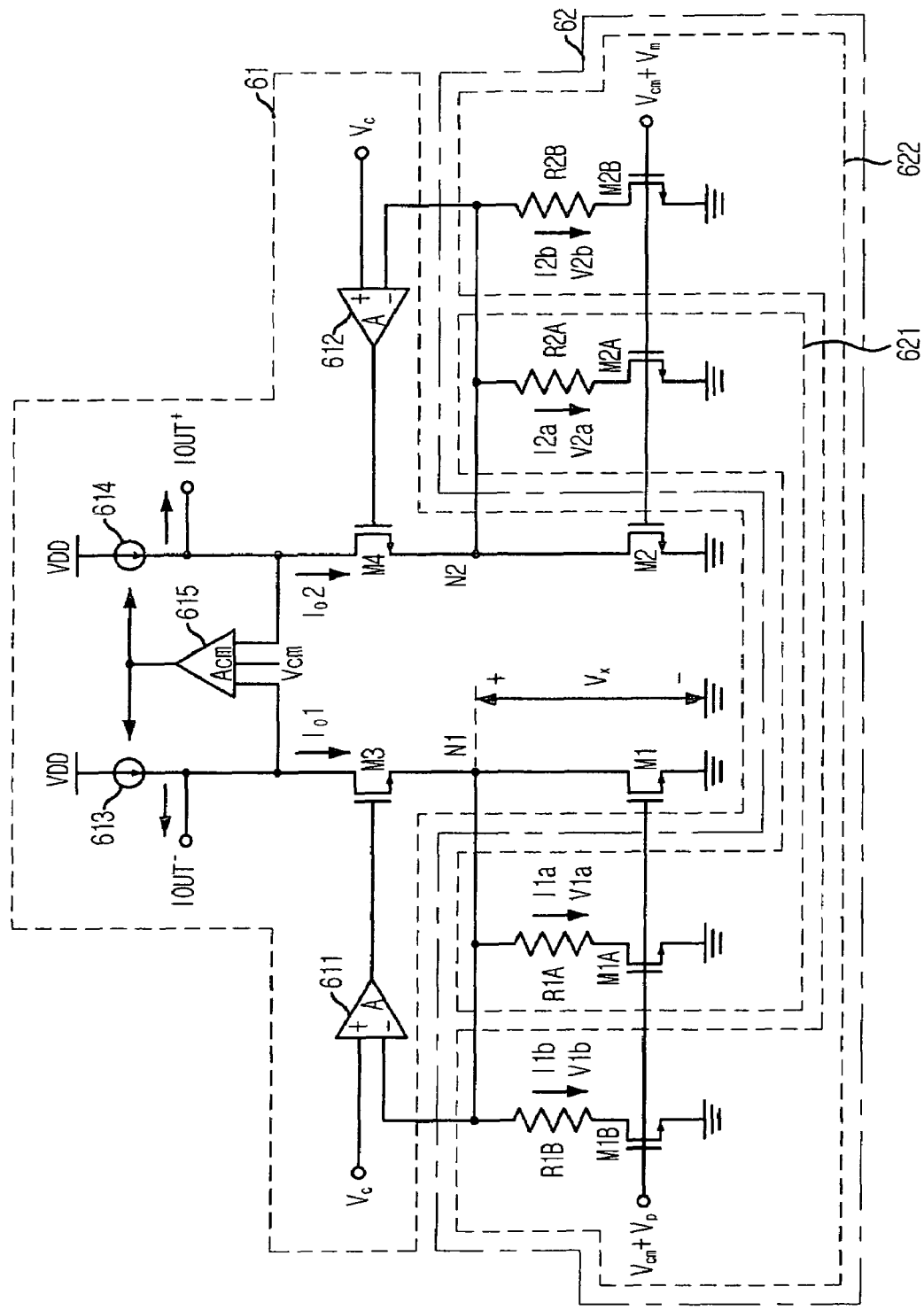
FIG. 13 is a circuit diagram of a triode region type OTA in accordance with a fifth embodiment of the present invention.

FIG. 13 is a circuit diagram of a triode region type OTA in accordance with a fifth embodiment of the present invention. In FIGS. 6 and 13, the same reference numerals refer to the same elements. A duplicate description about the elements that have been already described with reference to FIG. 6 will be omitted.

A difference between the OTA of FIG. 13 and the OTA of FIG. 6 is that a common mode feedback (CMFB) amplifier 615 is further included between a first current source 613 and a second current source 614 of the first transconductor 61 in order to maintain a common mode.

The common mode feedback amplifier 615 has a common mode gain (Acm) and a common mode voltage input terminal. A first output terminal IOUT− of the first transconductor 61 connected to the common mode feedback amplifier 615 maintains the common mode. Likewise, a second output terminal IOUT+ of the first transconductor 61 connected to the common mode feedback amplifier 615 also maintains the common mode.

Embodiment 6

Figure 14:
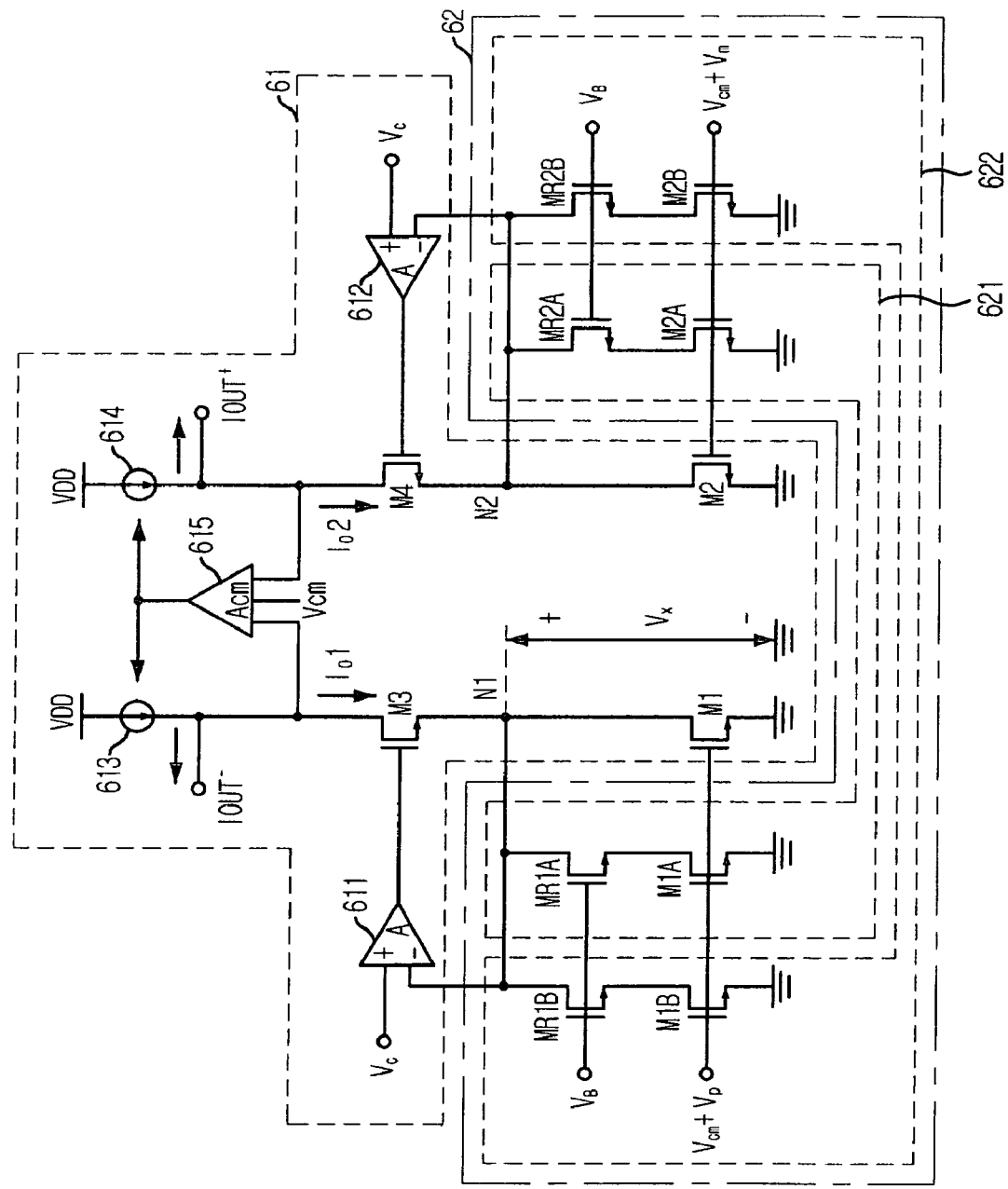
FIG. 14 is a circuit diagram of a triode region type OTA in accordance with a sixth embodiment of the present invention.

FIG. 14 is a circuit diagram of a triode region type OTA in accordance with a sixth embodiment of the present invention. In FIGS. 10 and 14, the same reference numerals refer to the same elements. A duplicate description about the elements that have been already described with reference to FIG. 10 will be omitted.

A difference between the OTA of FIG. 14 and the OTA of FIG. 10 is that a common mode feedback amplifier 615 is disposed between a first current source 613 and a second current source 164 of a first transconductor 61 in order to maintain a common mode.

Embodiment 7

Figure 15:
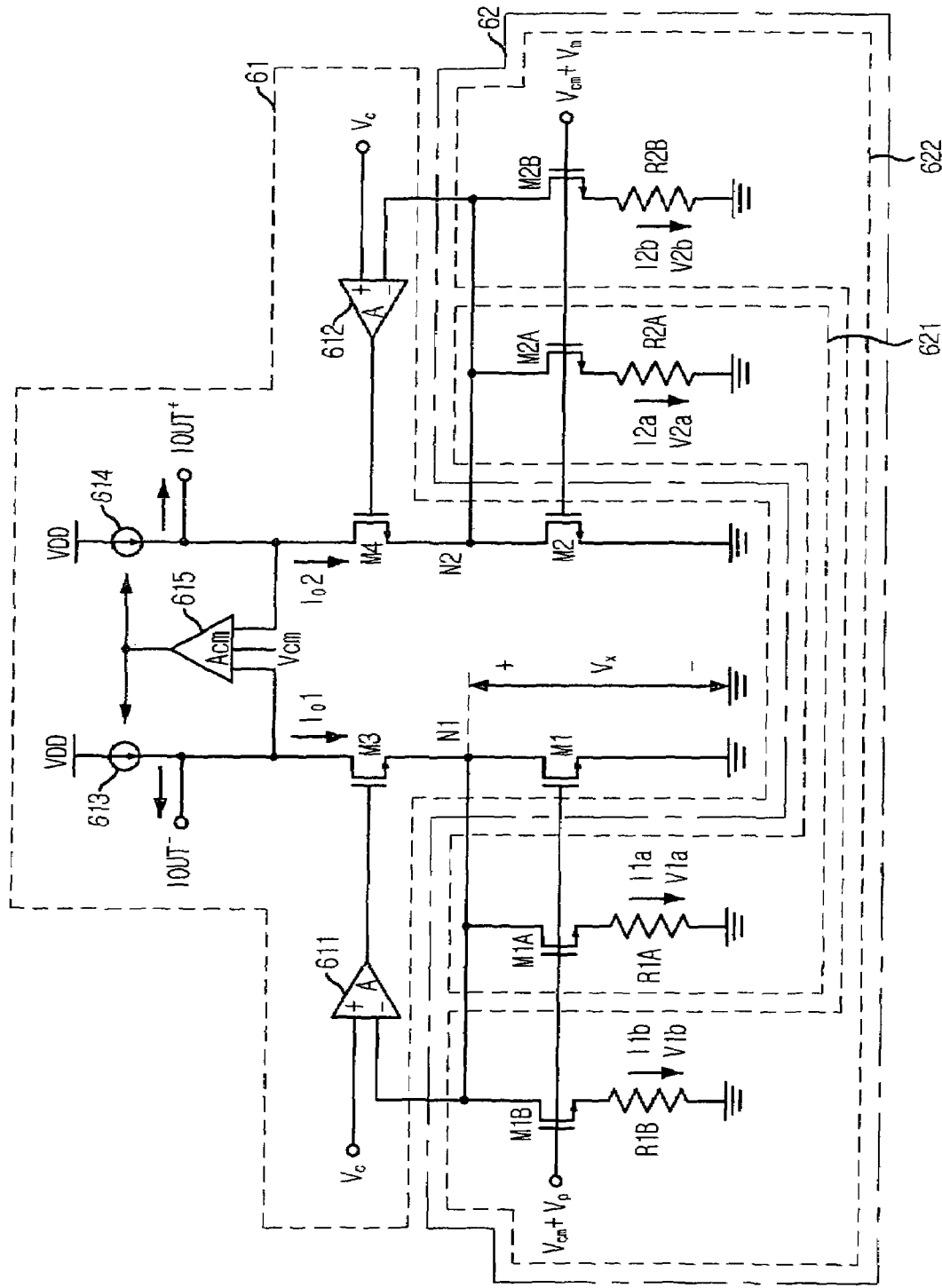
FIG. 15 is a circuit diagram of a triode region type OTA in accordance with a seventh embodiment of the present invention.

FIG. 15 is a circuit diagram of a triode region type OTA in accordance with a seventh embodiment of the present invention. In FIGS. 11 and 15, the same reference numerals refer to the same elements. A duplicate description about the elements that have been already described with reference to FIG. 11 will be omitted.

A difference between the OTA of FIG. 15 and the OTA of FIG. 11 is that a common mode feedback amplifier 615 is disposed between a first current source 613 and a second current source 614 of a first transconductor 61 in order to maintain a common mode.

Embodiment 8

Figure 16:
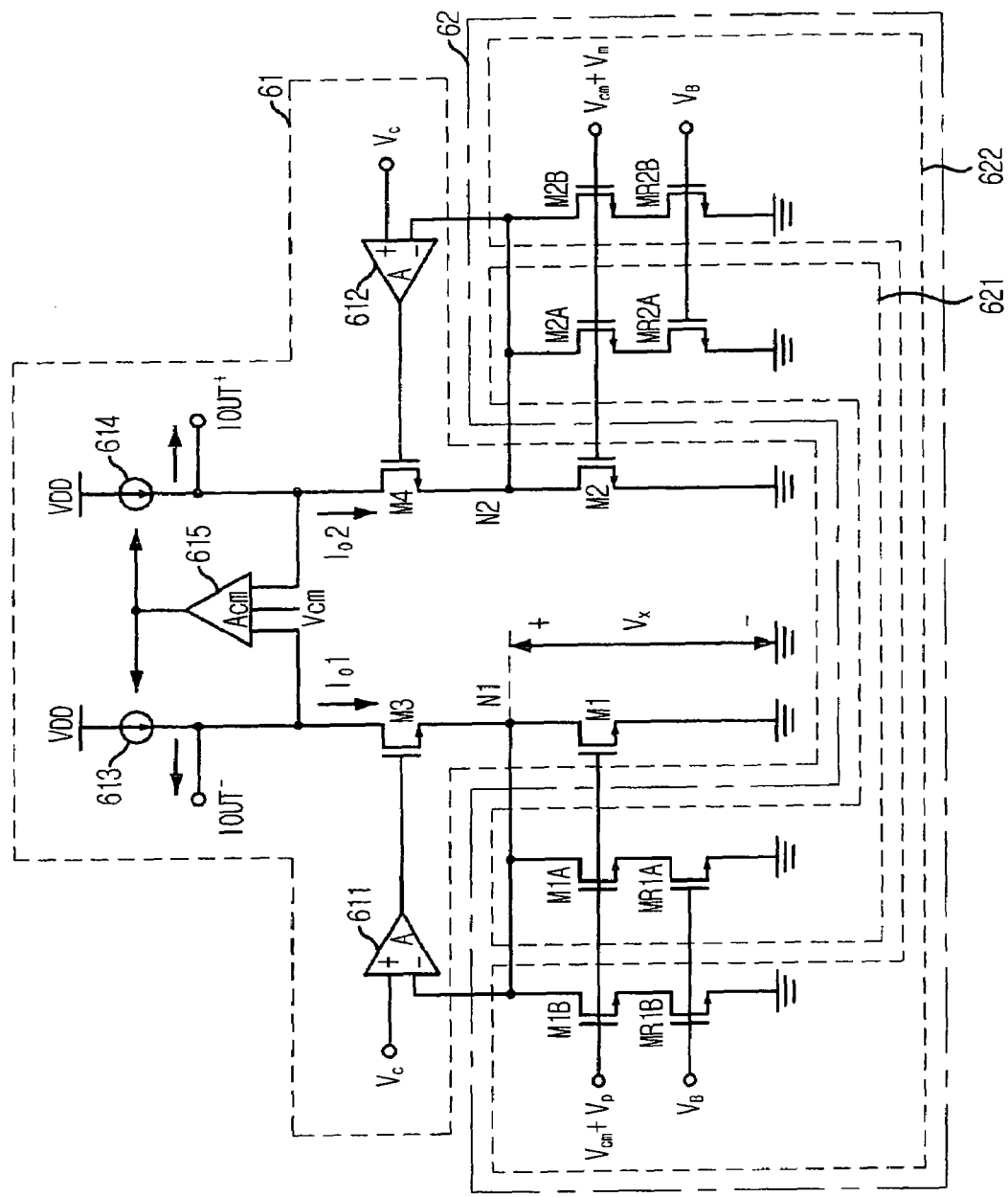
FIG. 16 is a circuit diagram of a triode region type OTA in accordance with an eighth embodiment of the present invention.

FIG. 16 is a circuit diagram of a triode region type OTA in accordance with an eighth embodiment of the present invention. In FIGS. 12 and 16, the same reference numerals refer to the same elements. A duplicate description about the elements that have been already described with reference to FIG. 12 will be omitted.

A difference between the OTA of FIG. 16 and the OTA of FIG. 12 is that a common mode feedback amplifier 615 is disposed between a first current source 613 and a second current source 614 of a first transconductor 61 in order to maintain a common mode.

Although the above-described embodiments include two distortion transconductance generating units, three or more distortion transconductances can be further provided in parallel in order to generate transconductance that is more precise and has a small error.

As described above, using the input transistors having a short channel length, a wide linear input range can be provided even at a low voltage by overlapping the basic transconductance ($g_{m0}$) with a plurality of distortion transconductances ($g_{m1}, g_{m2}, \ldots, g_{mn}$).

The present application contains subject matter related to Korean patent application No. KR2006-0081309, filed in the Korean Intellectual Property Office on Aug. 25, 2006, the entire contents of which is incorporated herein by reference.

While the present invention has been described with respect to certain preferred embodiments, it will be apparent to those skilled in the art that various changes and modifications may be made without departing from the scope of the invention as defined in the following claims.

What is claimed is:

1. A linearization apparatus of a triode region type operational transconductance amplifier comprising:
    a first transconductor unit for receiving differential pair input voltages through differential pair input MOS transistors operating in the triode region and generating a basic transconductance; and
    a second transconductor unit for receiving the same differential pair input voltages, generating distortion transconductances, and overlapping the basic transconductance with the distortion transconductance for extending a linear range of a final transconductance,
    wherein the second transconductor unit includes a plurality of differential input cells,
    and the differential input cells connect in parallel with drain nodes of the input transistors of the first transconductor unit.

2. The linearization apparatus of the triode region type operational transconductance amplifier as recited in claim 1, wherein the plurality of differential input cells includes MOS transistor and a resistor element.

3. The linearization apparatus of the triode region type operational transconductance amplifier as recited in claim 2, wherein the differential input cells of the second transconductor unit comprise the MOS transistor of which source connected with ground and the resistor element connected with the MOS transistor's drain.

4. The linearization apparatus of the triode region type operational transconductance amplifier as recited in claim 2, wherein the differential input cells of the second transconductor unit comprise a resistor element connected with ground and the MOS transistor of which source connected with the resistor element.

5. The linearization apparatus of the triode region type operational transconductance amplifier as recited in claim 2, wherein the resistor element is a passive resistor element or an active resistor element implemented with MOS transistors.

6. The linearization apparatus of the triode region type operational transconductance amplifier as recited in claim 1, wherein width to length (W/L) ratios of the differential input transistors of the second transconductor unit are set differently with fixed cascode resistances or resistances of the resistor elements are set differently with fixed W/L ration of the differential input transistors for adjusting distortion transconductances by determining currents flowing through the resistor elements.

7. The linearization apparatus of the triode region type operational transconductance amplifier as recited in claim 1, wherein the first and second differential input transistors operate in a triode region by using a regulated-cascode circuit,
    wherein the regulated cascode circuit comprises:
    a MOS transistor having a source connected to a drain of the first differential input transistor, and a drain connected to an output terminal; and
    a negative amplifier having a negative input terminal connected to the MOS transistor's source, and an output terminal connects to the MOS transistor's gate.

* * * * *